United States Patent
Park

(10) Patent No.: US 7,064,482 B2
(45) Date of Patent: Jun. 20, 2006

(54) ORGANIC ELECTROLUMINESCENT DISPLAY PANEL DEVICE AND METHOD OF FABRICATING THE SAME

(75) Inventor: Jae-Yong Park, Gyeonggi-do (KR)

(73) Assignee: LG.Philips LCD Co., Ltd., Seoul (KR)

(*) Notice: Subject to any disclaimer, the term of this patent is extended or adjusted under 35 U.S.C. 154(b) by 314 days.

(21) Appl. No.: 10/716,438

(22) Filed: Nov. 20, 2003

(65) Prior Publication Data

US 2004/0100191 A1 May 27, 2004

(30) Foreign Application Priority Data

Nov. 26, 2002 (KR) ............ 10-2002-0074012

(51) Int. Cl.
*H05B 33/00* (2006.01)

(52) U.S. Cl. .............. 313/504; 313/506; 313/512

(58) Field of Classification Search ........ 313/504–506, 313/512; 428/917; 315/169.3; 345/36, 345/45, 76

See application file for complete search history.

(56) References Cited

U.S. PATENT DOCUMENTS

| | | | |
|---|---|---|---|
| 6,175,345 B1 | 1/2001 | Kuribayashi et al. | |
| 6,548,961 B1 | 4/2003 | Barth et al. | |
| 6,798,132 B1 * | 9/2004 | Satake | .......... 313/495 |
| 6,828,950 B1 * | 12/2004 | Koyama | .......... 345/76 |
| 2002/0036462 A1 * | 3/2002 | Hirano | .......... 313/506 |
| 2002/0140643 A1 * | 10/2002 | Sato | .......... 345/76 |
| 2002/0158577 A1 | 10/2002 | Shimoda et al. | |
| 2003/0127972 A1 | 7/2003 | Han et al. | |

FOREIGN PATENT DOCUMENTS

| | | |
|---|---|---|
| JP | 2001-177509 | 4/2001 |
| KR | 2002-0047889 | 6/2002 |
| KR | 2004-0079476 | 9/2004 |
| WO | 01/62051 | 2/2001 |
| WO | WO-02/078101 | 10/2005 |

* cited by examiner

Primary Examiner—Ashok Patel
(74) *Attorney, Agent, or Firm*—Morgan, Lewis & Bockius, LLP

(57) ABSTRACT

An organic electroluminescent device includes first and second substrates having pixel regions and a peripheral region, a first common electrode at the peripheral region on the first substrate, a driving thin film transistor (TFT) at each of the pixel regions on the first substrate, a first connection electrode connected to a drain electrode of the TFT, a second connection electrode connected to the first common electrode, a first electrode on the second substrate, isolating patterns on the first electrode corresponding to each border between the pixel regions, a first insulating pattern on the first electrode corresponding to the second connection electrode, partition walls on the isolating patterns, an organic luminescent layer on the first electrode, a second electrode on the organic luminescent layer connected to the first connection electrode at each of the pixel regions, and a first contacting electrode on the first insulating pattern contacting the first electrode.

14 Claims, 15 Drawing Sheets

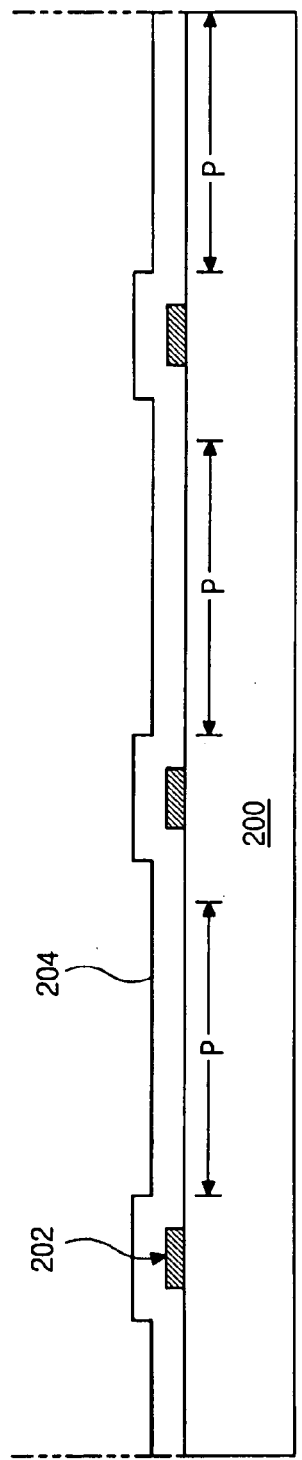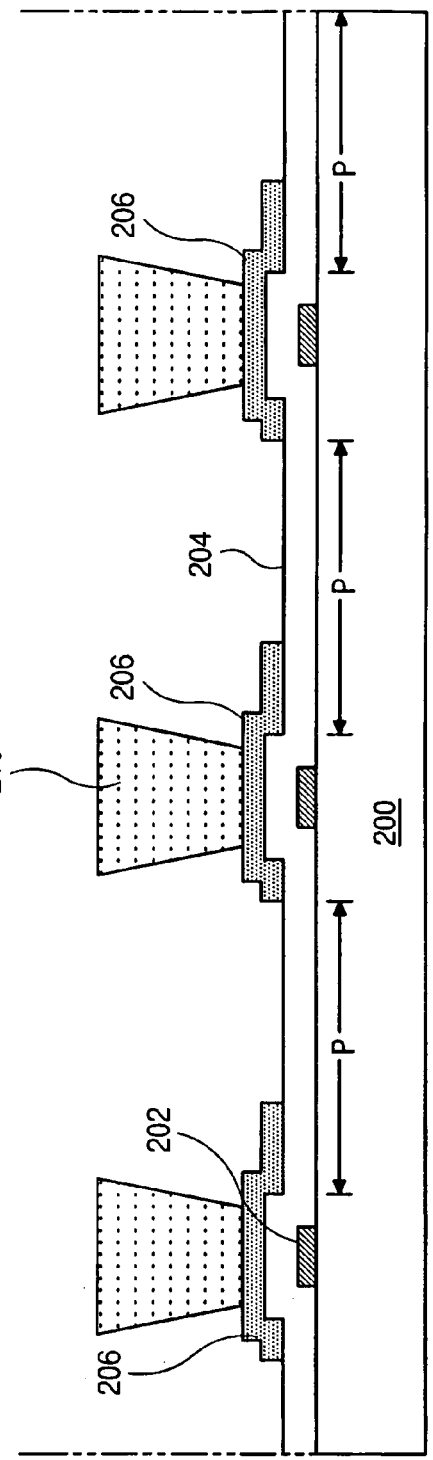

ORGANIC ELECTROLUMINESCENT DISPLAY PANEL DEVICE AND METHOD OF FABRICATING THE SAME

The present invention claims the benefit of the Korean Patent Application No. P2002-074012 filed in Korea on Nov. 26, 2002, which is hereby incorporated by reference.

BACKGROUND OF THE INVENTION

1. Field of the Invention

The present invention relates to an organic electroluminescent display panel device and method of fabricating the same, and more particularly, to an organic electroluminescent display panel device and a method of fabricating the same that has a high aperture ratio and high definition images.

2. Discussion of the Related Art

In general, an organic electroluminescent device emits light by injecting electrons from a cathode electrode and holes from an anode electrode into an emissive layer, combining the electrons and the holes to generate an exciton, and transiting the exciton from an excited state to a ground state. Since the organic electroluminescent device is self-luminescent and does not require an additional light source, the organic electroluminescent device has a small size and is light weight, as compared to a liquid crystal display device. The organic electroluminescent device also has low power consumption, high brightness, and short response time. Thus, the organic electroluminescent device is used in many consumer electronics, such as cellular phones, car navigation systems (CNSs), personal digital assistants (PDAs), camcorders, and palm PCs. In addition, the organic electroluminescent device can have reduced manufacturing costs because of its simple manufacturing processes.

Organic electroluminescent devices may be categorized into passive matrix-type and active matrix-type depending upon how the device is driven. Compared to an active matrix-type, passive matrix-type organic electroluminescent devices have a simpler structure and are fabricated through a simpler manufacturing process. However, the passive matrix-type organic electroluminescent devices have higher power consumption, thereby preventing use in large area displays. Furthermore, in passive matrix organic electroluminescent devices, aperture ratio decreases according to the increasing number of electrical lines. Thus, the passive matrix-type organic electroluminescent devices are commonly used as small-sized display devices. In contrast, active matrix-type organic electroluminescent devices are commonly used as large-sized display devices since they have high luminous efficacy, and provide high definition images.

FIG. 1 is a cross sectional view of an organic electroluminescent display panel device according to the related art. In FIG. 1, the organic electroluminescent device 10 includes a first substrate 12 and a second substrate 28, that face each other with a predetermined space therebetween. A plurality of thin film transistors T and a plurality of first electrodes 16 are formed on an inner surface of the first substrate 12, wherein each of the first electrodes 16 are connected to each of the thin film transistors T, respectively. In addition, organic luminescent layers 18 are formed on the first electrodes 16 and the thin film transistors T, and a second electrode 20 is formed on the organic luminescent layers 18. The organic luminescent layers 18 emit light in one of three colors: red (R), green (G), and blue (B) within a pixel region P, and are generally formed by patterning an organic material.

A desiccant 22 is formed on an inner surface of the second substrate 28 to remove any external moisture and air that may permeate into a space between the first and second substrates 12 and 28. The inner surface of the second substrate 28 is patterned to form a groove, and the desiccant 22 is disposed within the groove and is fastened with a tape 25.

A sealant 26 is formed between the first and second substrates 12 and 28, and surrounds array elements, such as the thin film transistors T, the first electrodes 16, the organic luminescent layers 18, and the second electrodes 20. The sealant 26 attaches the first and second substrates 12 and 28 together and forms an airtight space to protect the elements from the external moisture and air.

FIG. 2 is a plane view of a pixel of the organic electroluminescent display panel device of FIG. 1. In FIG. 2, the pixel includes a switching thin film transistor (TFT) $T_S$, a driving thin film transistor (TFT) $T_D$, and a storage capacitor $C_{ST}$. In addition, a gate line 32 and a data line 34 are formed on the first substrate 12, and are formed of a transparent material, such as glass and plastic. The gate line 32 and the data line 34 cross each other, thereby defining the pixel region P, and a power line 35 is formed parallel to the data line 34.

The switching TFT $T_S$ includes a gate electrode 36, an active layer 40, a source electrode 46, and a drain electrode 50. The driving TFT $T_D$ includes a gate electrode 38, an active layer 42, a source electrode 48, and a drain electrode 52. In particular, the gate electrode 36 of the switching TFT $T_S$ connects to the gate line 32, and the source electrode 46 of the switching TFT $T_S$ connects to the data line 34. The drain electrode 50 of the switching TFT $T_S$ connects to the gate electrode 38 of the driving TFT $T_D$ through a first contact hole 54, and the source electrode 48 of the driving TFT $T_D$ connects to the power line 35 through a second contact hole 56. The drain electrode 52 of the driving TFT $T_D$ connects to the first electrode 16 in the pixel region P. A capacitor electrode 15 overlaps the power line 35 to form the storage capacitor $C_{ST}$, and is made of doped polycrystalline silicon and connects to the drain electrode 50 of the switching TFT $T_S$.

FIG. 3 is a layout of the organic electroluminescent display panel device of FIG. 1. In FIG. 3, a display area is defined in a central region of the first substrate 12. A data pad portion E is formed in an upper side of the first substrate 12, and a first gate pad portion F1 and a second gate pad portion F2 are formed in left and right sides of the first substrate 12, respectively. A common electrode 39 is formed in a lower side of the substrate 12. The common electrode 39 applies a common voltage to the second electrode 20, which functions as a cathode electrode and is formed over the display area, and maintains the common voltage.

FIG. 4A is a cross sectional view along IVA—IVA of FIG. 2. In FIG. 4A, the driving TFT $T_D$ is formed on the substrate 12, and includes the gate electrode 38, the active layer 42, and the source and drain electrodes 48 and 52. The storage capacitor $C_{ST}$ is formed over the substrate 12 and is parallel connected to the driving TFT $T_D$. The storage capacitor $C_{ST}$ includes the capacitor electrode 15 and the power line 35, which function as a first capacitor electrode and a second capacitor electrode, respectively. The capacitor electrode 15 is made of polycrystalline silicon. An insulating layer 57 covers the driving TFT $T_D$ and the storage capacitor $C_{ST}$, and the first electrode 16 is formed on the insulating layer 57 to electrically contact the drain electrode 52. An organic luminescent layer 18 that emits one color of light is formed on the first electrode 16, and the second electrode 20 is formed on the organic layer 18.

FIG. 4B is a cross sectional view along IVB—IVB of FIG. 3. In FIG. 4B, the common electrode 39 is formed in a side of the substrate 12 to apply a common voltage to the second electrode 20 (FIG. 4A). The common electrode 39 may be made of the same material as the gate electrode 38 of the driving TFT $T_D$ (FIG. 4A). The common electrode 39 is exposed by a first common contact hole 60 and a second common contact hole 62 through insulating layers. The second electrode 20 connects to the common electrode 39. An input line (not shown) from the outside could connect to the common electrode 39 through the second common contact hole 62.

A yield of the organic electroluminescent device depends on yields of the thin film transistor and the organic layer. Especially, the yield of the organic electroluminescent device varies due to impurities in the process of forming the organic layer to a thickness of about 1,000 Å. Accordingly, the yield of the organic electroluminescent device of the related art is reduced because of the impurities, thereby resulting in a loss of manufacturing costs and source materials for the thin film transistor.

Moreover, the organic electroluminescent device of the related art is a bottom emission mode device having stability and degrees of freedom for the manufacturing processes. However, the bottom emission mode device has a reduced aperture ratio. Thus, the bottom emission mode organic electroluminescent device has difficulty in being used as a high aperture device.

On the other hand, a top emission mode organic electroluminescent device has a high aperture ratio, and is easy to manufacture. However, in the top emission mode organic electroluminescent device, since a cathode electrode is generally disposed over the organic layer, a choice of material with which to make the cathode electrode is limited. Accordingly, transmittance of light is limited, and a luminous efficacy is reduced. Furthermore, in order to improve light transmittance the passivation layer should be formed as a thin film, whereby the exterior moisture and air is not fully blocked.

SUMMARY OF THE INVENTION

Accordingly, the present invention is directed to an organic electroluminescent display panel device and a method of fabricating the same that substantially obviate one or more of the problems due to limitations and disadvantages of the related art.

An object of the present invention is to provide an organic electroluminescent display panel device and a method of fabricating the same having a high aperture ratio and high definition images.

Another object of the present invention is to provide an organic electroluminescent display panel device and a method of fabricating the same having an improved yield and productivity.

Another object of the present invention is to provide an organic electroluminescent display panel device and a method of fabricating the same that are reliable.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the organic electroluminescent device includes first and second substrates facing and spaced apart from each other, the first and second substrates having a display area including a plurality of pixel regions and a first peripheral region at one side of the display area, a first common electrode at the first peripheral region on an inner surface of the first substrate, a driving thin film transistor at each of the pixel regions on the inner surface of the first substrate, the driving thin film transistor including an active layer, a gate electrode, and source and drain electrodes, a first connection electrode connected to the drain electrode of the driving thin film transistor at each of the pixel regions, a second connection electrode connected to the first common electrode at the first peripheral region, a first electrode on an entire inner surface of the second substrate, isolating patterns on the first electrode corresponding to each border between the pixel, regions, a first insulating pattern at the first peripheral region on the first electrode corresponding to the second connection electrode, partition walls on the isolating patterns, an organic luminescent layer at each of the pixel regions on the first electrode, a second electrode on the organic luminescent layer connected to the first connection electrode at each of the pixel regions, a first contacting electrode on the first insulating pattern contacting the first electrode, and a sealant attaching the first and second substrates.

In another aspect, the method of fabricating an organic electroluminescent device includes forming an insulating layer on a first substrate having a display area including a plurality of pixel regions and a first peripheral region at one side of the display area, forming a driving thin film transistor at each of the plurality of pixel regions on the insulating layer, the driving thin film transistor including an active layer, a gate electrode, and source and drain electrodes, forming a first common electrode at the first peripheral region on the insulating layer, forming a first connection electrode and a second connection electrode, the first connection electrode connected to the drain electrode, the second connection electrode connected to the first common electrode, forming a first electrode on a second substrate, forming isolating patterns and a first insulating pattern on the first electrode, the isolating patterns corresponding to each border between the pixel regions, the first insulating pattern at the first peripheral region, forming partition walls on the isolating patterns, forming an organic luminescent layer at each of the plurality of pixel regions on the first electrode, forming a second electrode on the organic luminescent layer, forming a first contacting electrode on the first insulating pattern and contacting the first electrode, and attaching the first and second substrates with a sealant such that the first connection electrode contacts the second electrode and the second connection electrode contacts the first contacting electrode.

In another aspect, the method of fabricating an organic electroluminescent device includes forming a first insulating layer on a first substrate having a display area including a plurality of pixel regions and a first peripheral region at one side of the display area, forming an active layer on the first insulating layer at each of the plurality of pixel regions, the active layer including polycrystalline silicon, the active layer having source and drain regions, forming a second insulating layer on the active layer, forming a gate electrode on the second insulating layer over the active layer, forming a third insulating layer on the gate electrode, the third insulating layer having first and second contact holes, the first contact hole exposing the source region, the second contact hole exposing the drain region, forming source and drain electrodes and a first common electrode on the third insulating layer, the source electrode being connected to the source region through the first contact hole, the drain electrode connected to the drain region through the second electrode, the first common electrode disposed at the peripheral region, forming a fourth insulating layer on the source and drain electrodes and the first common electrode, the fourth insulating layer having third, fourth and fifth contact holes, the third contact hole exposing the drain electrode, the fourth and fifth contact holes exposing the first common electrode, forming first and second connection electrodes on the fourth insulating layer, the first connection pattern connected to the drain electrode through third contact hole, the second connection electrode connected to the first common electrode through the fourth contact hole, forming a first electrode on a second substrate, forming isolating patterns and a first insulating pattern on the first electrode, the isolating patterns corresponding to each border between the pixel regions, the first insulating pattern at the first peripheral region, forming partition walls on the isolating patterns, forming an organic luminescent layer at each of the plurality of pixel regions on the first electrode, forming a second electrode on the organic luminescent layer, forming a first contacting electrode on the first insulating pattern and contacting the first electrode, and attaching the first and second substrates with a sealant such that the first connection electrode contacts the second electrode and the second connection electrode contacts the first contacting electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIGS. 9A to 9D are cross-sectional views showing an exemplary fabricating process for a display area of a second substrate for an organic electroluminescent device according to the present invention;

DETAILED DESCRIPTION OF THE PREFERRED EMBODIMENTS

Reference will now be made in detail to the preferred embodiments of the present invention, an example of which is illustrated in the accompanying drawings.

Figure 5:
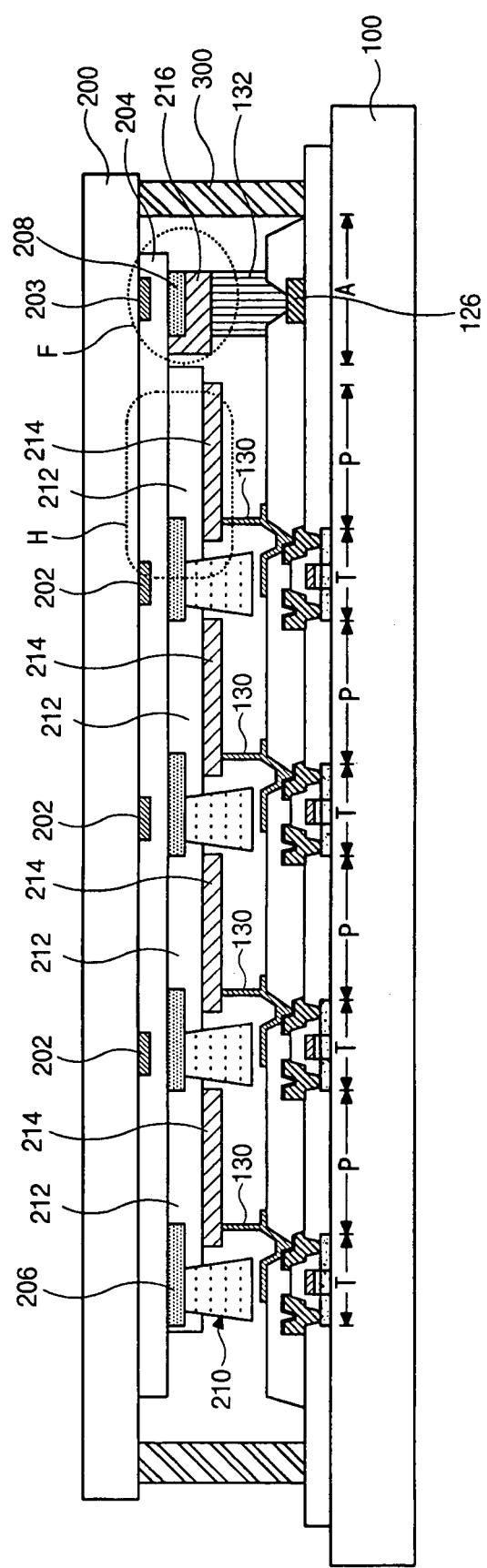
FIG. 5 is a cross sectional view of an exemplary organic electroluminescent display panel device according to the present invention.

FIG. 5 is a cross sectional view of an exemplary organic electroluminescent display panel device according to the present invention. In FIG. 5, the organic electroluminescent device may include a first substrate 100 and a second substrate 200 that are spaced apart and face each other. A sealant 300 may be used to attach the first and second substrates 100 and 200 together. The first and second substrates 100 and 200 may include a plurality of pixel regions P, which constitute a display area, and a peripheral region A, which is disposed at a side of the display area. In addition, a plurality of thin film transistors T may be formed on an inner surface of the first substrate 100 adjacent to the plurality of pixel regions P, respectively, wherein the thin film transistor T may function as a driving thin film transistor of the organic electroluminescent device. Although not shown, a plurality of switching thin film transistors and array lines also may be formed on the inner surface of the first substrate 100.

A plurality of first auxiliary electrodes 202 may be formed on an inner surface of the second substrate 200 and a first electrode 204 may be formed on the entire inner surface of the second substrate 200 covering the first auxiliary electrodes 202. The first electrode 204 may function as an anode for injecting holes, and may receive a common voltage. In addition, a plurality of isolating patterns 206 may be formed on the first electrode 204 by depositing and patterning an insulating material. Further, a plurality of partition walls 210 may be formed on the plurality of isolating patterns 206, such that the isolating patterns 206 and the partition walls 210 correspond to borders between the pixel regions P. Between the adjacent partition walls 210, a plurality of organic luminescent layers 212 and a plurality of second electrodes 214 may be subsequently formed on the first electrode 204. The plurality of second electrodes 214 may function as a cathode for injecting electrons. Each of the second electrodes 214 may be electrically connected to each of the thin film transistors T through a first connection electrode 130. The first connection electrodes 130 may be first formed on the inner surface of the first substrate 100, and the first substrate 100 may then be attached to the second substrate 200 by the sealant 300, such that the first connection electrodes 130 contact the second electrodes 214, respectively.

In addition, a common electrode 126 may be formed over the inner surface of the first substrate 100 in the peripheral region A. A second auxiliary electrode 203 may be formed on the inner surface of the second substrate 200 in the peripheral region A before forming the first electrode 204, such that the first electrode 204 covers the second auxiliary electrode 203. The second auxiliary electrode 203 may be made of a same material as the first auxiliary electrodes 202. Further, an insulating pattern 208 may be formed on the first electrode 204 over the second auxiliary electrode 203, and a contacting electrode 216 may be formed on the insulating pattern 208 to be directly connected to the first electrode 204. The insulating pattern 208 may be made of a same material as the isolating pattern 206, and may be simultaneously formed during the process of forming the isolating pattern 206. Also, the contacting electrode 216 may be made of a same material as the second electrode 214, and may be simultaneously formed during the process of forming the second electrodes 214. The contacting electrode 216 may electrically connect to the common electrode 126 through a second connection electrode 132.

Accordingly, the first and second connection electrodes 130 and 132 maintain uniform gaps both in the pixel regions P and the peripheral region A, thereby preventing the common voltage being poorly applied to the first electrode 204 through the second connecting electrode 132.

Figure 6A:
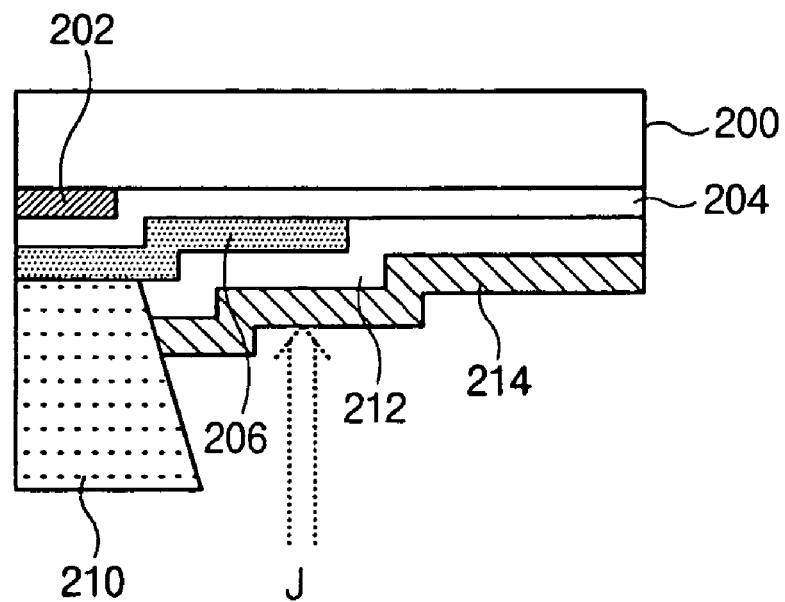
FIG. 6A is a cross sectional view of region H of FIG. 5.
Figure 6B:
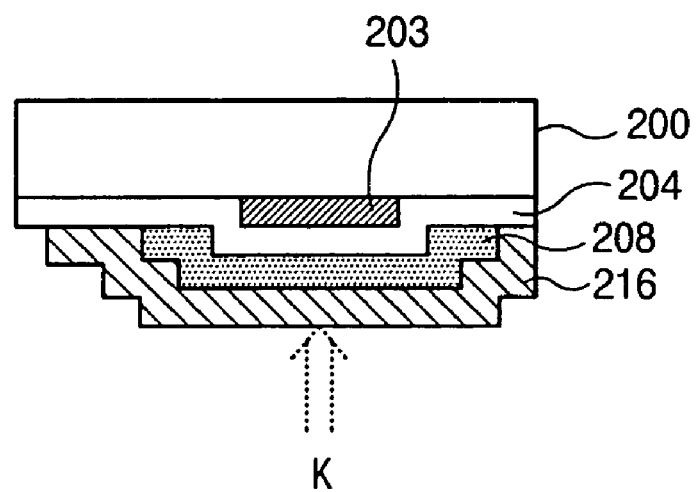
FIG. 6B is a cross sectional view of region I of FIG. 5.

FIG. 6A is a cross sectional view of region H of FIG. 5, and FIG. 6B is a cross sectional view of region I of FIG. 5. In FIG. 6A, the first auxiliary electrode 202, the first electrode 204, the isolating pattern 206, the partition wall 210, the organic luminescent layer 212 and the second electrode 214 are formed on the inner surface of the second substrate 200. A first portion J, where the first connecting electrode 130 of FIG. 5 would contact the second substrate 200, may include only the first electrode 204, the isolating pattern 206, the organic luminescent layer 212 and the second electrode 214. In FIG. 6B, a second portion K, where the second connecting electrode 132 of FIG. 5 would contact the second substrate 200, may include only the second auxiliary electrode 203, the first electrode 204, the insulating pattern 208, and the contact electrode 216. The first and second auxiliary electrodes 202 and 203 may have a thickness within a range of about 500 Å to 3,000 Å. The first electrode 204 may have a thickness within a range of about 1,000 Å to 2,000 Å. The isolating pattern 206 and the insulating pattern 208 may have a thickness within a range of about 500 Å to 3,000 Å. The organic luminescent layer 212 may have a thickness within a range of about 1,000 Å to 2,000 Å, and the second electrode 214 and the contact electrode 216 may have a thickness within a range of about 500 Å to 3,000 Å. Accordingly, the layers of the first portion J may have a first thickness within a range of about 3,000 Å to 10,000 Å and the layers of the second portion K may have a second thickness within a range of about Å 2,500 to 11,000 Å. Thus, the first thickness and the second thickness may be similar to each other.

Figure 1:
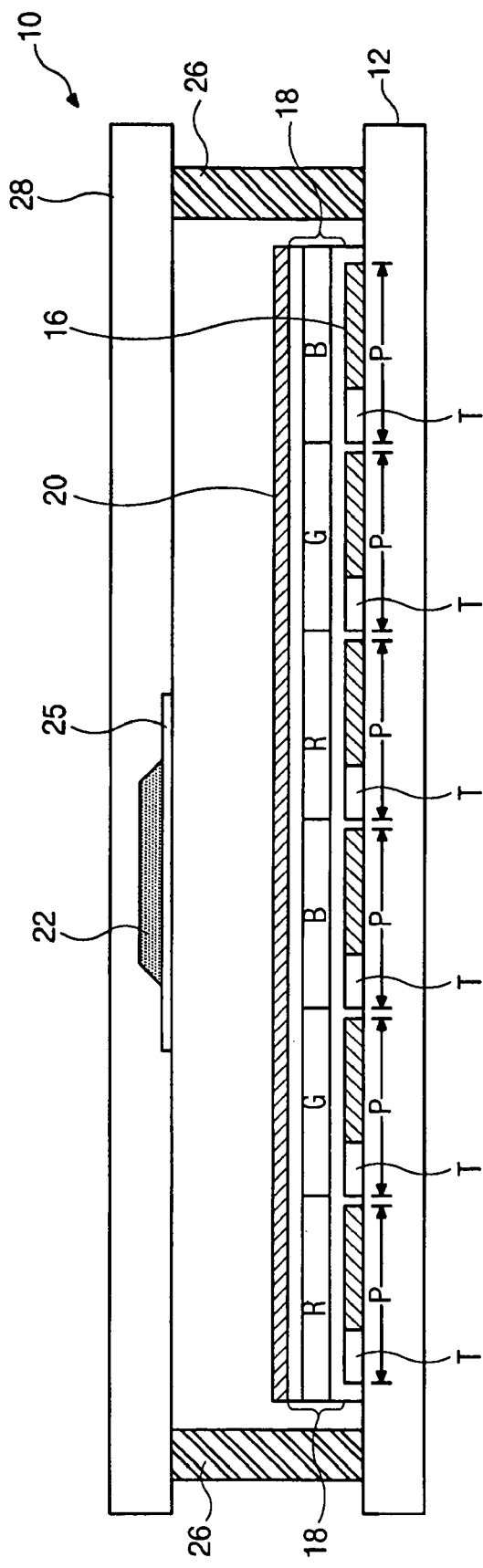
FIG. 1 is a cross sectional view of an organic electroluminescent display panel device according to the related art.
Figure 2:
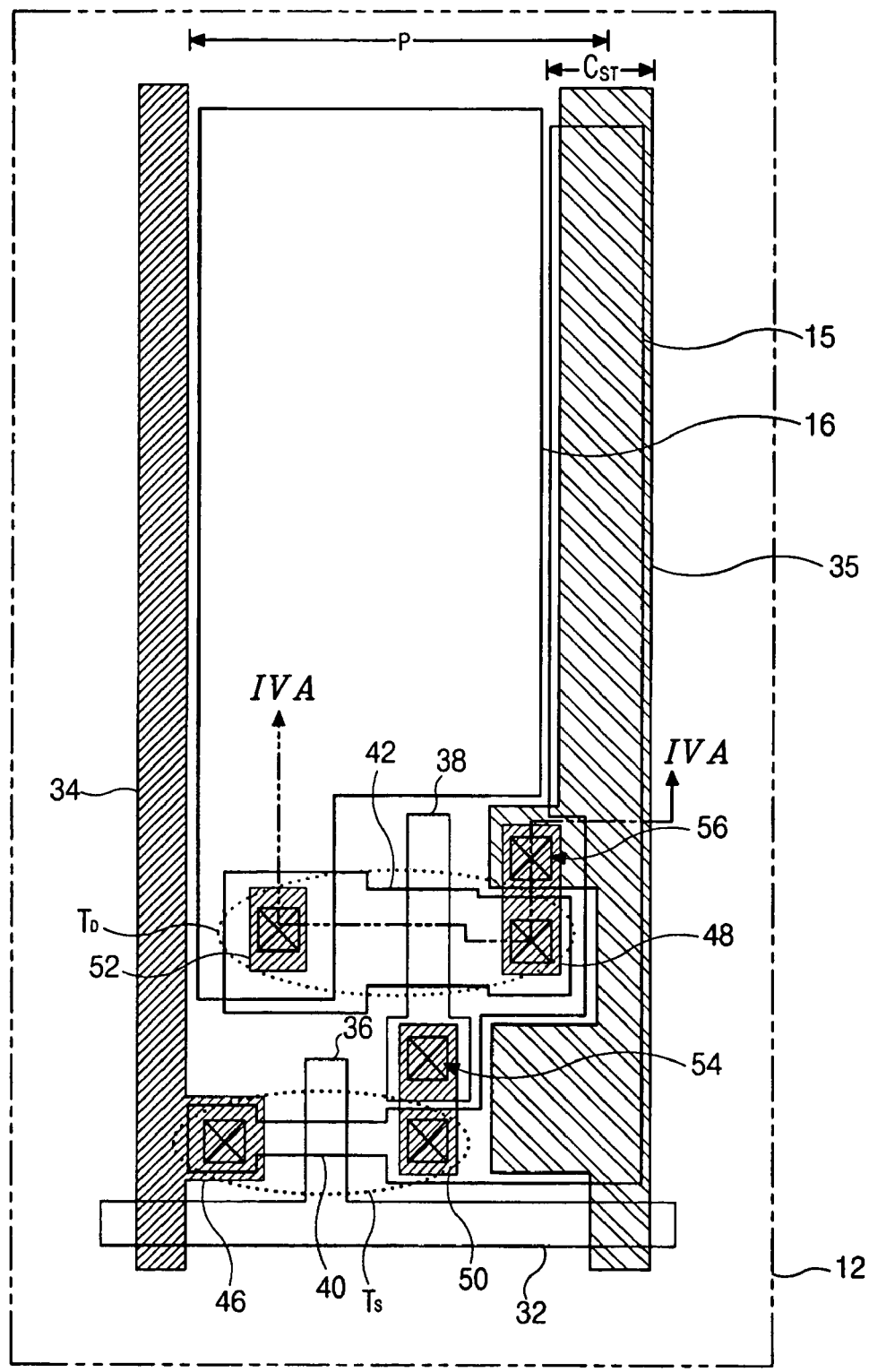
FIG. 2 is a plane view of a pixel of the organic electroluminescent display panel device of FIG. 1.
Figure 3:
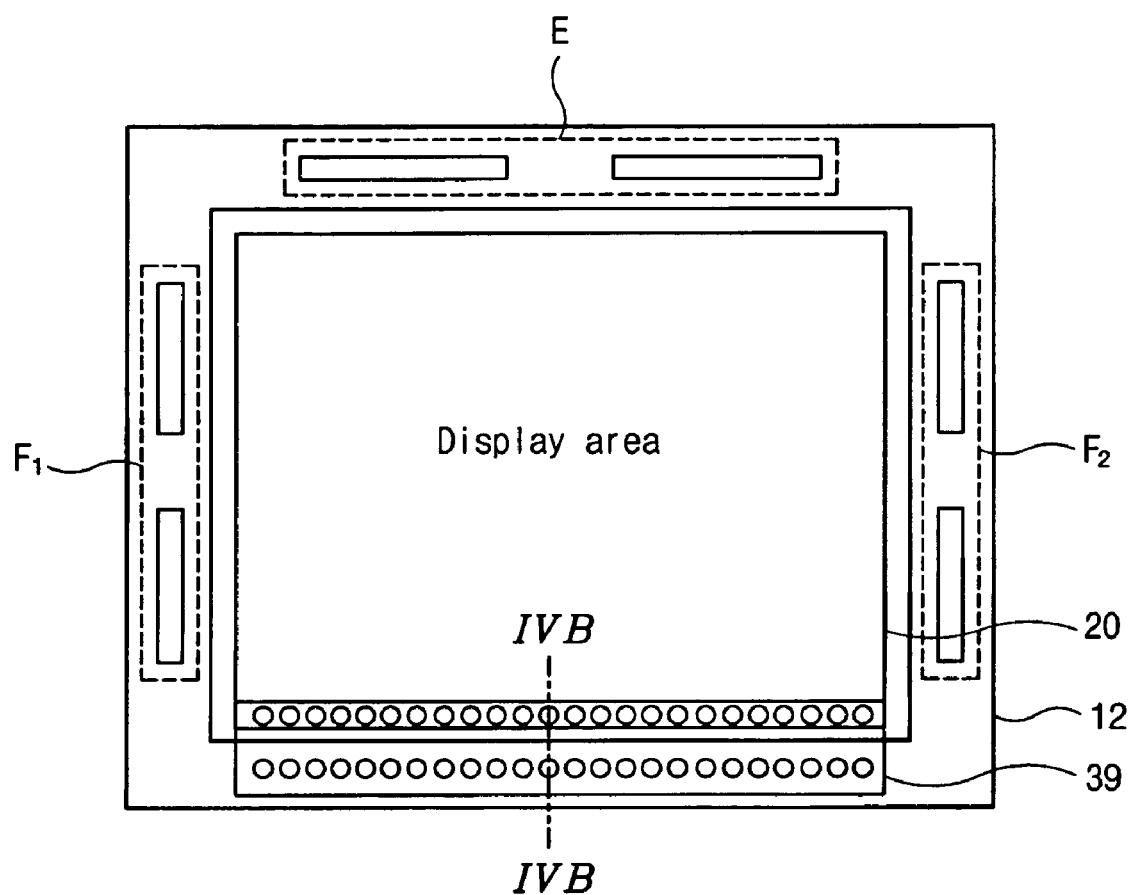
FIG. 3 is a layout of the organic electroluminescent display panel device of FIG. 1.
Figure 4A:
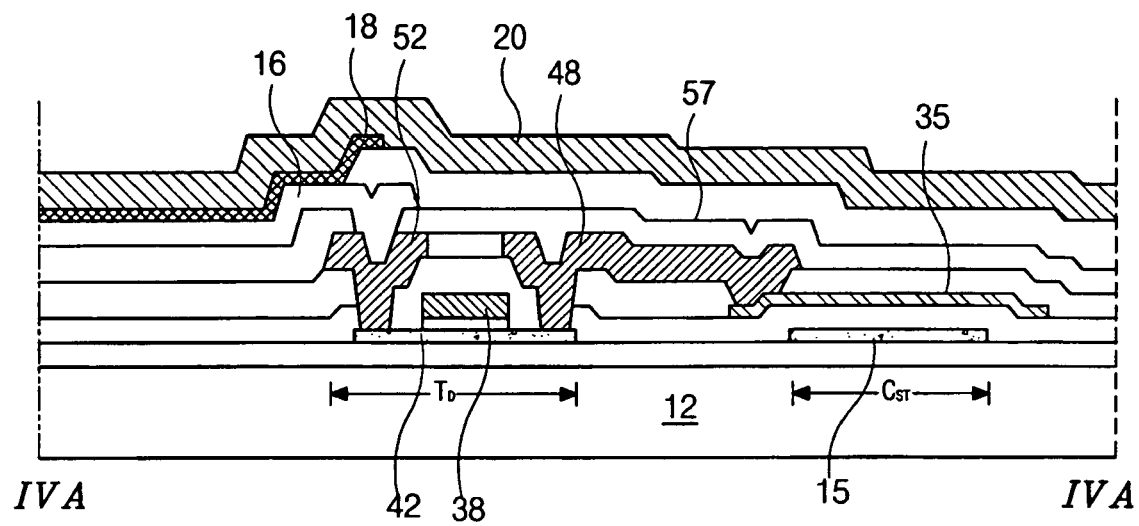
FIG. 4A is a cross sectional view along IVA—IVA of FIG. 2.
Figure 4B:
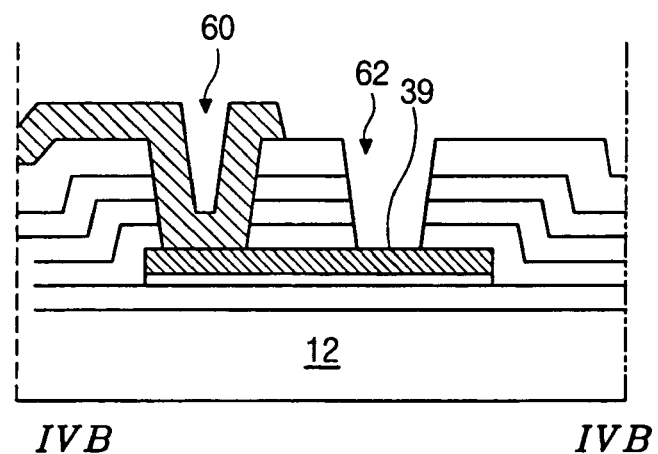
FIG. 4B is a cross sectional view along IVB—IVB of FIG. 3.
Figure 7A:
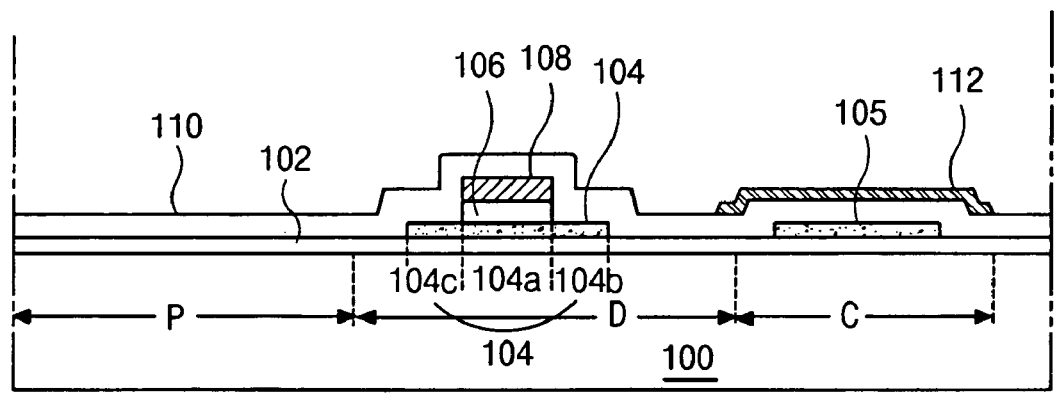
FIGS. 7A to 7C are cross-sectional views showing an exemplary fabricating process for a pixel region of a first substrate for an organic electroluminescent device according to the present invention.
Figure 7B:
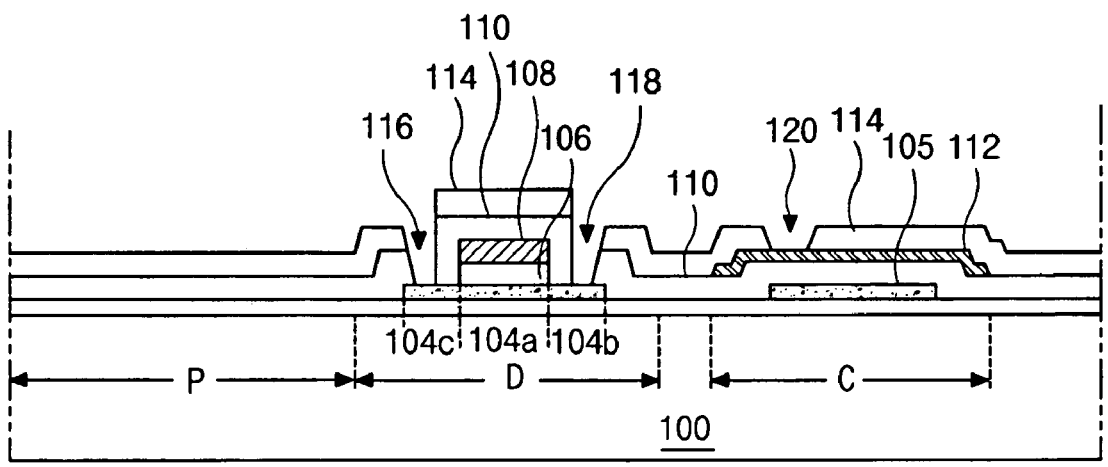
Figure 7C:
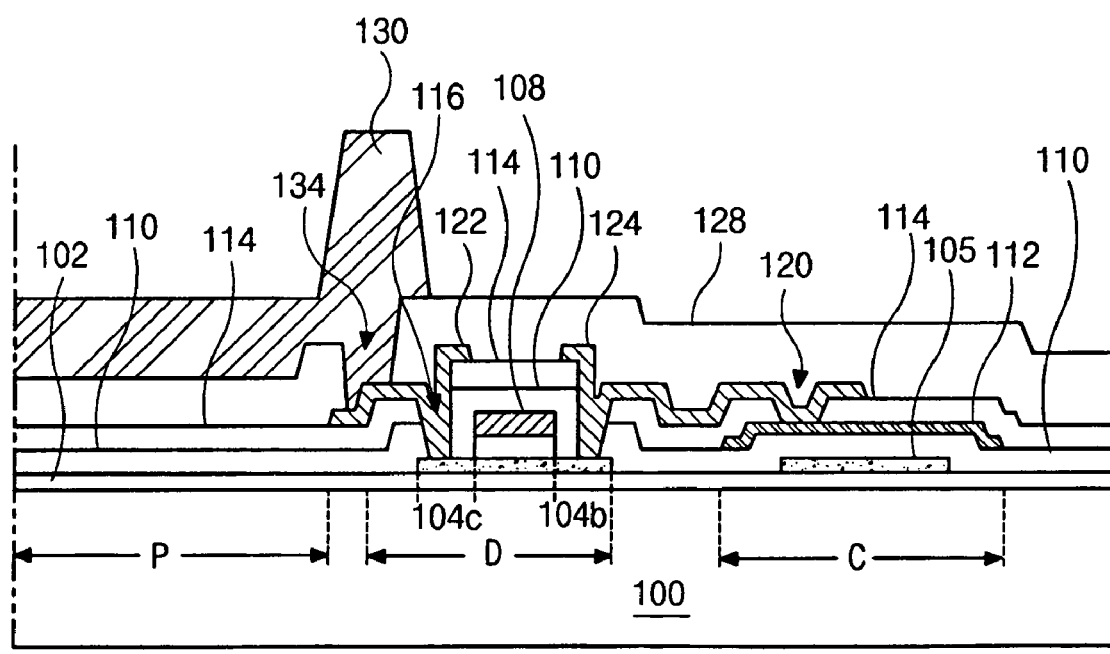
Figure 8A:
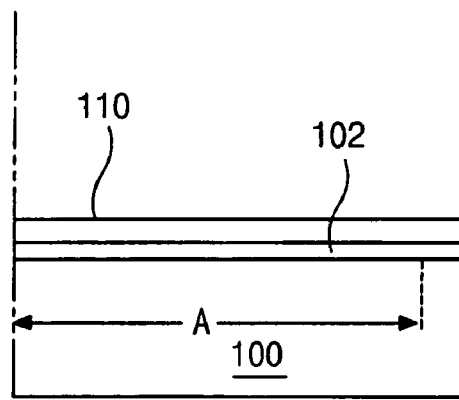
FIGS. 8A to 8C are cross-sectional views showing an exemplary fabricating process for a peripheral region of the first substrate for an organic electroluminescent device according to the present invention.
Figure 8B:
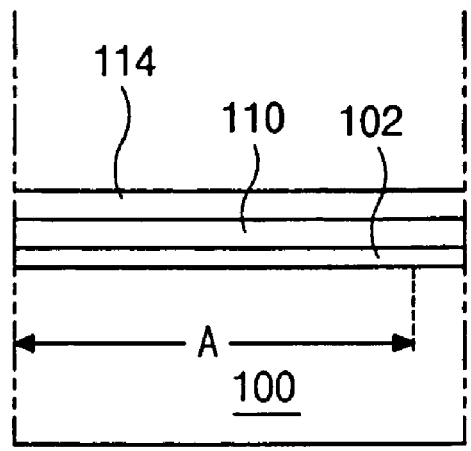
Figure 8C:
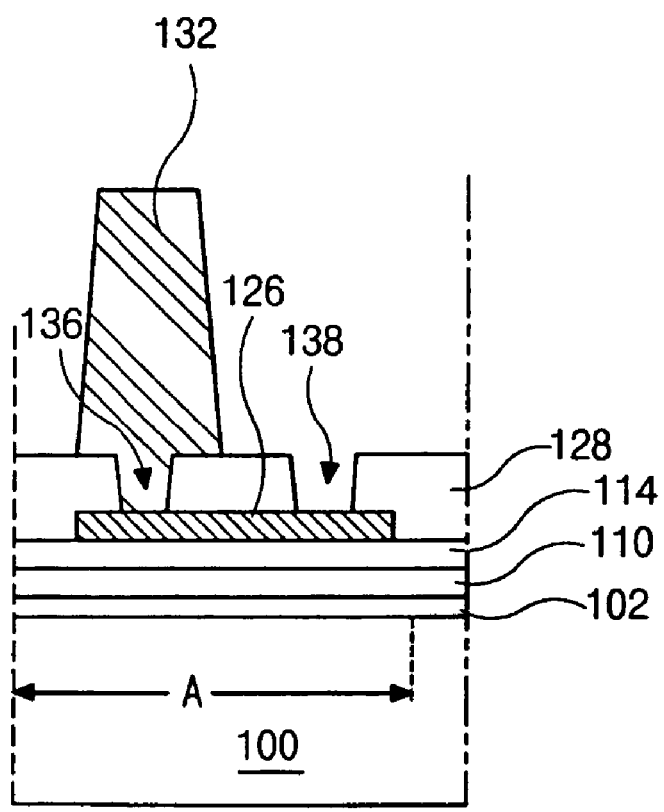

FIGS. 7A to 7C are cross-sectional views showing an exemplary fabricating process for a pixel region of a first substrate for an organic electroluminescent device according to the present invention. FIGS. 8A to 8C are cross-sectional views showing an exemplary fabricating process for a peripheral region of the first substrate for an organic electroluminescent device according to the present invention. In particular, FIGS. 7A to 7C may correspond to cross-sections along IVA—IVA of FIG. 2, and FIGS. 8A to 8C correspond to cross-sections along IVB—IVB of FIG. 3. In FIGS. 7A and 8A, a first substrate 100 may include a pixel region P, a driving region D, a storage region C and a peripheral region A. A buffer layer 102 may be formed on an entire surface of the first substrate 100 as a first insulating layer by depositing one of silicon nitride ($SiN_x$) and silicon oxide ($SiO_2$). A polycrystalline pattern 104 and a second polycrystalline pattern 105 of polycrystalline silicon may be formed on the buffer layer 102 within the driving and storage regions D and C, respectively. For example, the first and second polycrystalline patterns 104 and 105 can be formed through a dehydrogenation process and a crystallization process using a heat after deposition of amorphous silicon. The second polycrystalline pattern 105 may function as a first electrode of a storage capacitor by doping with impurities. A gate insulating layer 106 as a second insulating layer and a gate electrode 108 may be sequentially formed on a central portion of the first polycrystalline pattern 104. The gate insulating layer 106 may be formed on the entire surface of the first substrate 100, and may be made of one of silicon nitride ($SiN_x$) and silicon oxide ($SiO_2$).

After forming the gate electrode 108, the first polycrystalline pattern 104 may be doped with impurities such as boron (B) or phosphorus (P) to define a channel region 104a corresponding to the gate electrode 108, and source and drain regions 104b and 104c at both sides of the channel region 104a. The second polycrystalline pattern 105 also may be doped with the impurities. The gate electrode 108 may be formed of one of aluminum (Al), aluminum (Al) alloy, copper (Cu), tungsten (W), tantalum (Ta) and molybdenum (Mo). An interlayer insulating layer 110 as a third insulating layer may be formed on the entire surface of the first substrate 100 covering the gate electrode 108. The interlayer insulating layer 110 may be formed of one silicon nitride ($SiN_x$) and silicon oxide ($SiO_2$). A capacitor electrode 112 may be formed on the interlayer insulating layer 110 within the storage region C by depositing and patterning one of aluminum (Al), aluminum (Al) alloy, copper (Cu), tungsten (W), tantalum (Ta) and molybdenum (Mo). The capacitor electrode 112 may be a part of a power line (not shown). The second polycrystalline pattern 105 and the capacitor electrode 112 overlapping the second active layer 105 constitute a storage capacitor with the interlayer insulating layer 110 interposed therebetween.

In FIGS. 7B and 8B, a fourth insulating layer 114 may be formed on the entire surface of the first substrate 100 covering the capacitor electrode 112. First, second and third contact holes 116, 118 and 120 may be formed in the fourth insulating layer 114 exposing the drain region 104c, the source region 104b, and the capacitor electrode 112, respectively.

In FIGS. 7C and 8C, source and drain electrodes 124 and 122 may be formed on the fourth insulating layer 114 by depositing and patterning one of chromium (Cr), molybdenum (Mo), tantalum (Ta) and tungsten (W). The source electrode 124 may contact the source region 104b through the second contact hole 118, and the drain electrode 122 may contact the drain region 104c through the first contact hole 116. A common electrode 126 also may be formed on the fourth insulating layer 114 within the peripheral region A. A fifth insulating layer 128 may be formed on the entire surface of the first substrate 100 covering the source and drain electrodes 124 and 122 and the common electrode 126. Fourth, fifth and sixth contact holes 134, 136 and 138 may be formed in the fifth insulating layer 128 exposing the drain electrode 122, and the both sides of the common electrode 126, respectively. Then, first and second connection electrodes 130 and 132 may be formed on the fifth insulating layer 128 by depositing and patterning a conductive metallic material. The first connection electrode 130 may contact the drain electrode 122 through the fourth contact hole 134 within the pixel region P. The second connection electrode 132 may contact the common electrode 126 through the fifth contact hole 136.

Figure 9C:
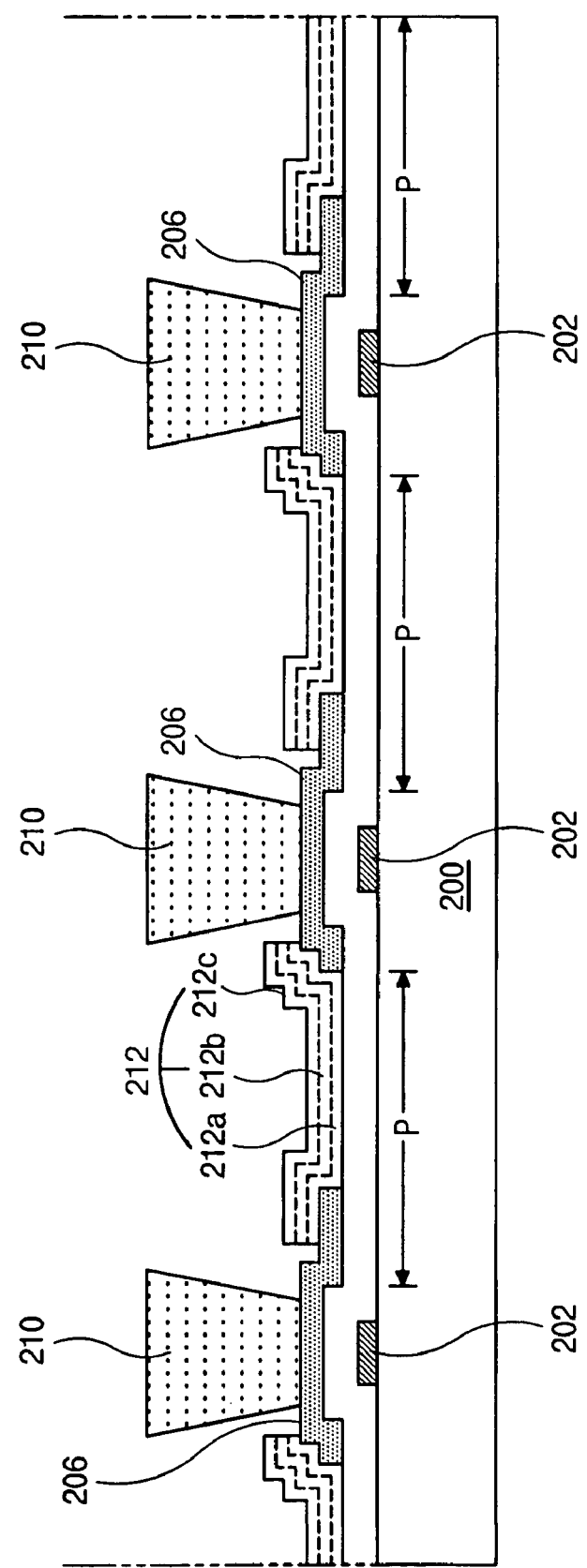

FIGS. 9A to 9D are cross-sectional views showing an exemplary fabricating process for a display area of a second substrate for an organic electroluminescent device according to the present invention. FIGS. 10A to 10D are cross-sectional views showing an exemplary fabricating process for a peripheral region of the second substrate for an organic electroluminescent device according to the present invention. In FIGS. 9A and 10A, a second substrate 200 may include a plurality of pixel regions P in the display area, and a peripheral region A at one side of the display area. A plurality of first auxiliary electrodes 202 may be formed on the second substrate 200 by depositing and patterning a metallic material having relatively low resistance. The plurality of first auxiliary electrodes 202 may have a lower resistance than a first electrode to be formed thereon later. For example, if the first electrode is made of indium-tin-oxide, the plurality of first auxiliary electrodes 202 may be made of one of chromium, molybdenum, aluminum, and aluminum alloy. A second auxiliary electrode 203 may be formed on the second substrate within the peripheral region A. The first auxiliary electrodes 202 may have a lattice form. Since the first auxiliary electrodes 202 may be made of an opaque metallic material, the first auxiliary electrodes 202 are disposed at regions where light is not emitted, i.e., at outsides of the pixel region P for displaying images. The first auxiliary electrodes 202 and the second auxiliary electrode 203 may be electrically connected at a certain place.

A first electrode 204 may be formed on an entire surface of the second substrate 200 covering the first auxiliary electrodes 202 and the second auxiliary electrode 203. The first electrode 204 may function as an anode for injecting holes into an organic luminescent layer to be formed thereon later. For example, the first electrode 204 may include indium-tin-oxide (ITO) or indium-zinc-oxide (IZO) that is transparent and has high work function. The first electrode 204 may receive a common voltage through the second connection electrode 132 of FIG. 8C at the peripheral region A.

Figure 10A:
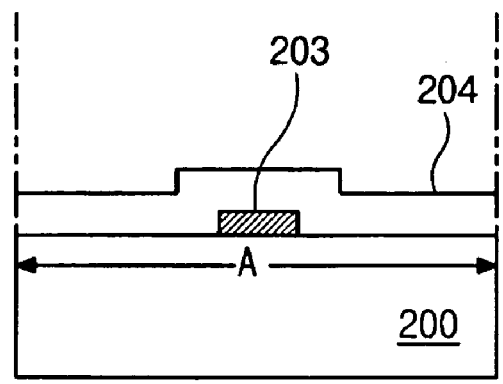
FIGS. 10A to 10D are cross-sectional views showing an exemplary fabricating process for a peripheral region of the second substrate for an organic electroluminescent device according to the present invention.
Figure 10B:
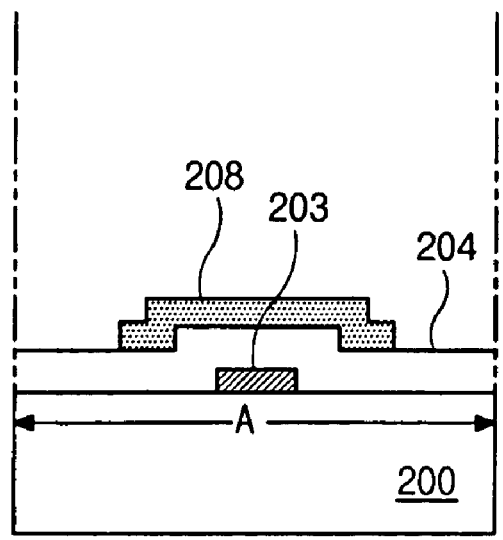

In FIGS. 9B and 10B, a plurality of isolating patterns 206 may be formed on the first electrode 204 over the first auxiliary electrodes 202 by using an insulating material. The isolating patterns 206 may have a lattice form in a plan view. An insulating pattern 208 of an island shape, which is made of the same material as the isolating patterns 206, may also be formed on the first electrode 204 over the second auxiliary electrode 203 within the peripheral region A. A plurality of partition walls 210, which also have a lattice form, may be formed on the isolating patterns 206. The plurality of partition walls 210 may be made of an insulating material including an photosensitive organic material. The plurality of partition walls 210 make a plurality of organic luminescent layers and a plurality of second electrodes to be separately formed by pixel regions P in the following processes.

Figure 10C:
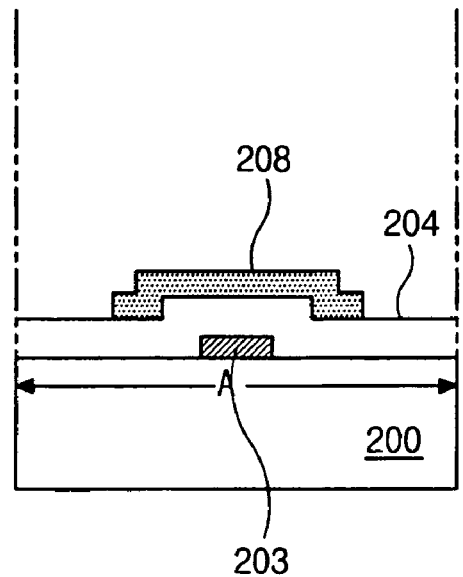

In FIGS. 9C and 10C, a plurality of organic luminescent layers 212 may be formed on the first electrode 204 in the pixel regions P. The organic luminescent layer 212 emitting one of red, green and blue colors corresponds to each of the pixel regions P. The organic luminescent layer 212 has a single layer or multiple layers. When the organic luminescent layer 212 has multiple layers, the organic luminescent layer 212 may include a hole transporting layer (HTL) 212a contacting the first electrode 204, an organic emitting layer 212b on the HTL 212a, and an electron transporting layer (ETL) 212c on the organic emitting layer 212b.

Figure 9D:
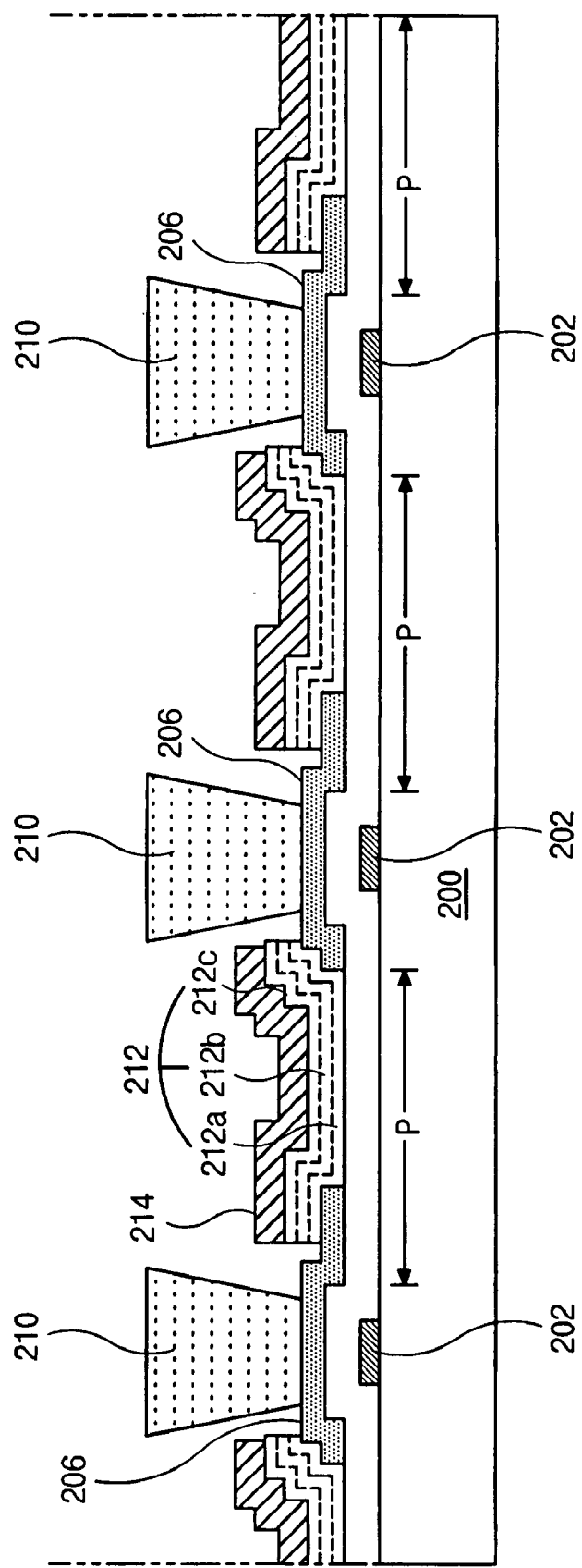
Figure 10D:
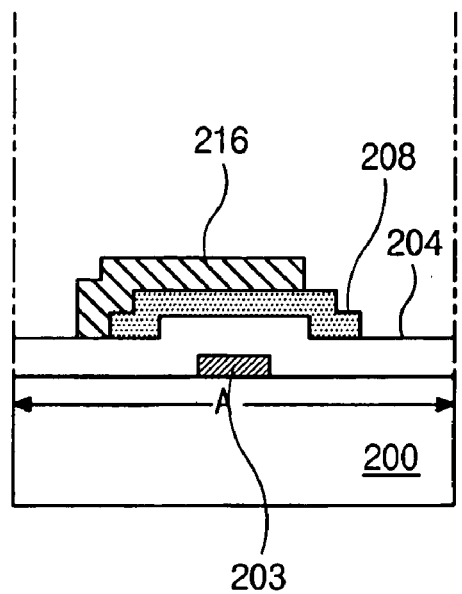

In FIGS. 9D and 10D, a plurality of second electrodes 214 may be formed on the organic luminescent layers 212. Each of the second electrodes 214 may correspond to each of the pixel regions P and may be separated from each other by the partition walls 210. In addition, the isolating patterns 206 under the partition walls 210 may prevent the second electrodes 214 from electrically contacting the first electrode 204. The plurality of second electrodes 214 may function as a cathode for injecting electrons into the organic luminescent layer 212. A contacting electrode 216 may be simultaneously formed on the insulating pattern 208 within the peripheral region A in a process of forming the second electrode 214. The contacting electrode 216 may contact the first electrode 204. The contacting electrode 216 may connect to the second connection electrode 132 of FIG. 8C, and may apply the common voltage to the first electrode 204 through the common electrode 126 and the second connection electrode 132 of FIG. 8C. The second electrodes 214 and the contacting electrode 216 may include a single layer of aluminum (Al), calcium (Ca) or magnesium (Mg), or multiple layers of lithium fluoride (LiF) or aluminum (Al). The plurality of second electrodes 214 may have a lower work function than the first electrode 204.

The first and second substrates 100 and 200 formed by fabricating processes of FIGS. 6A to 10D may be attached to each other with a sealant, thereby an organic electroluminescent device obtained.

Figure 11:
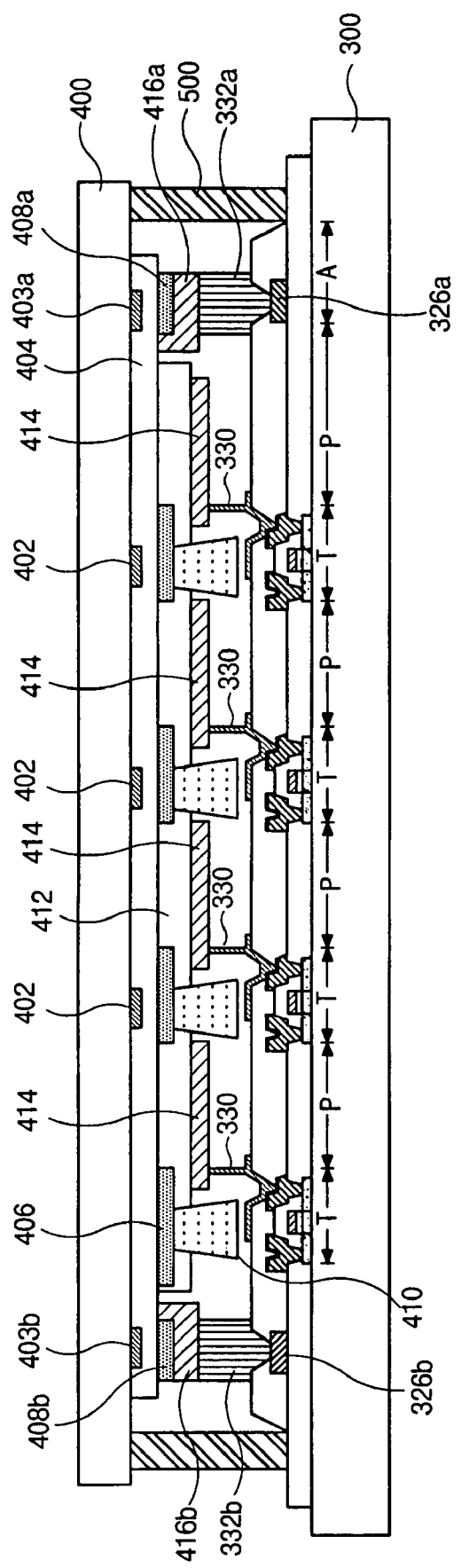
FIG. 11 is a cross-sectional view showing another exemplary organic electroluminescent device according to the present invention.

FIG. 11 is a cross-sectional view showing another exemplary organic electroluminescent device according to the present invention. In FIG. 11, first and second substrates 300 and 400 may be attached to each other with a predetermined space therebetween by a sealant 500. The first and second substrates 300 and 400 may have a plurality of pixel regions P, which constitute a display area, and peripheral regions A, which are disposed at both sides of the display area. A plurality of thin film transistors T and a plurality of array lines (not shown) may be formed on an inner surface of the first substrate 300. In particular, each of the thin film transistors T may be disposed adjacent of each of the pixel regions P.

A plurality of first auxiliary electrodes 402 may be formed on an inner surface of the second substrate 400 and a first electrode 404 may be formed on the entire inner surface of the second substrate 400 covering the first auxiliary electrodes 402. The first electrode 404 may function as an anode for injecting holes. In addition, a plurality of isolating patterns 406 made of an insulating material may be formed on the first electrode 404, and a plurality of partition walls 410 may be formed on the plurality of isolating patterns 406 corresponding to borders between the thin film transistors T and the pixel regions P. Between the adjacent partition walls 410, a plurality of organic luminescent layers 412 and a plurality of second electrodes 414 may be formed on the first electrode 404. The plurality of second electrodes 414 may function as a cathode for injecting electrons. Each of the plurality of second electrodes 414 may electrically connect to each of the thin film transistors T through a first connection electrode 330. That is, a plurality of first connection electrodes 330 may be first formed on the inner surface of the first substrate 300, and the first substrate 300 may be attached to the second substrate 400, such that the first connection electrodes 330 contact the second electrodes 414, respectively.

Common electrodes 326a and 326b may be formed over the inner surface of the first substrate 300 within the peripheral regions A. In addition, second auxiliary electrodes 403a and 403b may be formed on the inner surface of the second substrate 400 within the peripheral region A, such that the first electrode 404 covers the second auxiliary electrodes 403a and 403b. The second auxiliary electrodes 403a and 403b may be made of the same material as the first auxiliary electrodes 402. In addition, insulating patterns 408a and 408b may be formed on the first electrode 404 over the second auxiliary electrodes 403a and 403b, and contacting electrodes 416a and 416b may be formed on the insulating patterns 408a and 408b to be directly connected to the first electrode 404. The contacting electrodes 416a and 416b may be simultaneously formed during the process of forming the plurality of second electrodes 414. The contacting electrodes 416a and 416b may electrically connect to the common electrodes 326a and 326b through second connection electrodes 332a and 332b, respectively.

Accordingly, the first and second connection electrodes 330, 332a and 332b maintain uniform gaps both in the pixel regions P and the peripheral regions A. Also, since the organic electroluminescent device is a top emission type, a high aperture ratio can be obtained. Furthermore, since an array pattern including a thin film transistor and an organic luminescent layer are independently formed on an individual substrate, bad effects due to a fabricating process of the organic luminescent layer can be prevented, thereby improving a production yield. Moreover, since a second connection pattern is formed at a peripheral region to contact a first pad and a first electrode, inferiority due to a signal distortion can be prevented, thereby further improving the production yield.

It will be apparent to those skilled in the art that various modifications and variations can be made in the organic electroluminescent display panel device and the method of fabricating the same of the present invention without departing from the spirit or scope of the invention. Thus, it is intended that the present invention covers the modifications and variations of this invention provided they come within the scope of the appended claims and their equivalents.

What is claimed is:

1. An organic electroluminescent device, comprising:
   first and second substrates facing and spaced apart from each other, the first and second substrates having a display area including a plurality of pixel regions and a first peripheral region at one side of the display area;
   a first common electrode at the first peripheral region on an inner surface of the first substrate;
   a driving thin film transistor at each of the pixel regions on the inner surface of the first substrate, the driving thin film transistor including an active layer, a gate electrode, and source and drain electrodes;
   a first connection electrode connected to the drain electrode of the driving thin film transistor at each of the pixel regions;
   a second connection electrode connected to the first common electrode at the first peripheral region;
   a first electrode on an entire inner surface of the second substrate;
   isolating patterns on the first electrode corresponding to each border between the pixel regions;
   a first insulating pattern at the first peripheral region on the first electrode corresponding to the second connection electrode;
   partition walls on the isolating patterns;
   an organic luminescent layer at each of the pixel regions on the first electrode;
   a second electrode on the organic luminescent layer connected to the first connection electrode at each of the pixel regions;
   a first contacting electrode on the first insulating pattern contacting the first electrode; and
   a sealant attaching the first and second substrates.

2. The device according to claim 1, further comprising a first auxiliary electrode and a second auxiliary electrode between the second substrate and the first electrode, wherein the first auxiliary electrode corresponds to the isolating patterns and the second auxiliary electrode corresponds to the first insulating pattern.

3. The device according to claim 1, wherein the first insulating pattern includes a same material as the isolating patterns.

4. The device according to claim 1, wherein the second connection electrode includes a same material as the first connection electrode.

5. The device according to claim 1, wherein the first contacting electrode includes a same material as the second electrode.

6. The device according to claim 1, wherein the active layer includes polycrystalline silicon.

7. The device according to claim 1, further comprising a power line connected to the driving thin film transistor.

8. The device according to claim 7, further comprising a capacitor electrode overlapping the power line to a storage capacitor.

9. The device according to claim 1, wherein the first electrode is an anode for injecting holes into the organic luminescent layer and the second electrode is a cathode for injecting electrons into the organic luminescent layer.

10. The device according to claim 9, wherein the first electrode includes one of indium-tin-oxide (ITO) and indium-zinc-oxide (IZO).

11. The device according to claim 9, wherein the second electrode includes one of calcium (Ca), aluminum (Al) and magnesium (Mg).

12. The device according to claim 1, wherein the first common electrode is disposed at an interior of the sealant.

13. The device according to claim 1, further comprising a second common electrode on the inner surface of the first substrate, a third connection electrode connected to the second common electrode, a second insulating pattern on the first electrode, and a second contacting electrode on the second insulating pattern, wherein the second common electrode, the third connection electrode, the second insulating pattern and the second contacting electrode are disposed at a second peripheral region at another side of the display area, and the second contacting electrode contacts the first electrode and connects to the third connection electrode.

14. The device according to claim 13, further comprising a first auxiliary electrode, a second auxiliary electrode and a third auxiliary electrode between the second substrate and the first electrode, wherein the first auxiliary electrode corresponds to the isolating patterns, the second auxiliary electrode corresponds to the first insulating pattern, and the third auxiliary electrode corresponds to the second insulating pattern.

* * * * *